United States Patent
Someya et al.

(10) Patent No.: US 6,472,607 B1
(45) Date of Patent: Oct. 29, 2002

(54) ELECTRONIC CIRCUIT BOARD WITH KNOWN FLOW SOLDERING WARP DIRECTION

(75) Inventors: Keisuke Someya, Noda; Akira Okabe, Kashiwa, both of (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/506,929

(22) Filed: Feb. 18, 2000

(30) Foreign Application Priority Data

Feb. 26, 1999 (JP) .......................................... 11-052056

(51) Int. Cl.[7] .............................. H05K 1/00; H05K 1/16
(52) U.S. Cl. ...................... 174/250; 174/260; 174/261; 174/266; 361/760; 361/767; 361/777; 361/807
(58) Field of Search .................................. 174/250, 260, 174/261, 262, 263, 266, 267, 268, 52.1, 52.4; 361/760, 743, 748, 767, 777, 807, 808, 771, 774; 29/840, 843, 837, 839, 855, 842

(56) References Cited

U.S. PATENT DOCUMENTS

| | | | | |
|---|---|---|---|---|
| 4,803,308 A | * | 2/1989 | Taguchi | 174/68.5 |
| 4,835,345 A | | 5/1989 | Haarde | 174/68.5 |
| 5,243,143 A | * | 9/1993 | Throop et al. | 174/263 |
| 5,539,156 A | | 7/1996 | Chobot et al. | 174/266 |
| 5,604,333 A | | 2/1997 | Kennish et al. | 174/261 |
| 5,802,712 A | * | 9/1998 | Sakai et al. | 29/840 |

FOREIGN PATENT DOCUMENTS

| | | | |
|---|---|---|---|
| DE | 19527595 A1 | * | 8/1996 |
| JP | 411145601 A | * | 5/1991 |
| JP | 403222493 A | * | 10/1991 |
| JP | 404061397 A | * | 2/1992 |
| JP | 407030241 A | * | 1/1995 |
| JP | A 7-108744 A | | 4/1995 |
| JP | 410107406 A | * | 4/1998 |
| JP | 410135276 A | * | 5/1998 |
| JP | 410190163 A | * | 7/1998 |
| JP | 10-313168 | | 11/1998 |
| JP | 411126960 A | * | 5/1999 |
| JP | 411204930 A | * | 7/1999 |
| JP | 411068298 A | * | 9/1999 |
| JP | 411251734 A | * | 9/1999 |

* cited by examiner

*Primary Examiner*—David L. Talbott
*Assistant Examiner*—I B Patel
(74) *Attorney, Agent, or Firm*—Fitzpatrick, Cella, Harper & Scinto

(57) ABSTRACT

An electronic circuit board comprising a flow soldering surface and a plurality of lands is disclosed. The flow soldering surface has an upstream side, a downstream side, and a warp defining a warp direction. The plurality of lands are disposed on (i) the upstream side of the flow soldering surface and (ii) the downstream side of the flow soldering surface, and only said plurality of lands on the downstream side having extended portions extending along the warp direction.

6 Claims, 3 Drawing Sheets

ELECTRONIC CIRCUIT BOARD WITH KNOWN FLOW SOLDERING WARP DIRECTION

FIELD OF THE INVENTION

The present invention relates to an electronic circuit board and a soldering method therefor and, more particularly, to a technique for preventing an inter-terminal solder bridge formed in a flow soldering process for an electronic circuit board.

BACKGROUND OF THE INVENTION

To solder various types of component terminals and board wires of a conventional electronic circuit board to each other by a flow soldering method, components are temporarily fixed with an adhesive to corresponding component terminal soldering lands formed at predetermined portions on the board. Alternatively, the components are inserted in component insertion holes formed in the lands, are dipped in a molten solder jetting upward from a flow solder tank, and are passed through the molten solder at a predetermined speed.

It is known that when the terminal pitches of the component to be soldered are small, an inter-terminal bridge tends to form between the terminals of the component due to excessive solder. To remove the excessive solder on a board 102 having a periphery where components are to be mounted as shown in FIG. 3A, an extending land 106 as shown in FIG. 3B is formed most downstream of circular lands 105 on each connector 101 mounted along the arrow D of the flow solder conveyance direction. Such an extending land serves as a so-called excessive solder absorption land, which prevents a component inter-terminal bridge from being formed by the surface tension of the solder on the land that is removed from the solder tank.

Alternatively, the land at the terminal end of a component where an inter-terminal bridge tends to be formed is enlarged in a direction (to be referred to as a board flow direction D hereinafter) along which the component is passed above the molten solder and which is opposite to the flow direction.

SUMMARY OF THE INVENTION

With the conventional techniques described above, when a component having a small terminal pitch is to be arranged such that its terminal array direction along which the terminals of the component are aligned is perpendicular to the board flow direction, a solder bridge between the terminals is not prevented sufficiently, and solder bridges tend to form. It is also known that the board warps on its component mounting surface side due to thermal expansion caused by the heat of the molten solder. This also makes it difficult to prevent a component inter-terminal bridge from being formed by the surface tension of the solder on the land that is removed from the solder tank.

The present invention has therefore been made in view of the problems described above, and has as its object to provide an electronic circuit board which can solve a soldering error for a component arranged such that its terminal array is perpendicular to the convey direction of the electronic circuit board which is to be flow-soldered, and a soldering method therefor.

In order to solve the problems described above and to achieve the above object, according to the present invention, there is provided an electronic circuit board having a land formed on a flow soldering surface thereof for flow soldering, characterized by comprising an extending land formed to be substantially perpendicular to a convey direction for the flow soldering and to extend toward a downstream side of warp of the board.

The present invention is also characterized in that the extending land is formed for soldering a terminal of a multi-terminal component including a connector, at one portion on the downstream side of the warp.

The present invention is also characterized in that the warp is formed by thermal expansion that takes place during the flow soldering.

There is also provided a soldering method for an electronic circuit board having a land formed on a flow soldering surface thereof for flow soldering, characterized in that an electronic component is mounted on an electronic component mounting surface of a board having an extending land which is formed to be substantially perpendicular to a convey direction for the flow soldering and to extend toward a downstream side of warp of the board, and a molten solder is brought into contact with a lower surface of the electronic component mounting surface while conveying the board in the convey direction, thereby performing flow soldering. The present invention is also characterized in that the extending land is formed at one portion on the downstream side of the warp, and the flow soldering is performed after a terminal of a multi-terminal component including a connector is inserted in the extending land.

The present invention is characterized in that the warp is formed by thermal expansion that takes place during the flow soldering.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENT

A preferred embodiment of the present invention will be described with reference to the accompanying drawings.

Figure 1A:
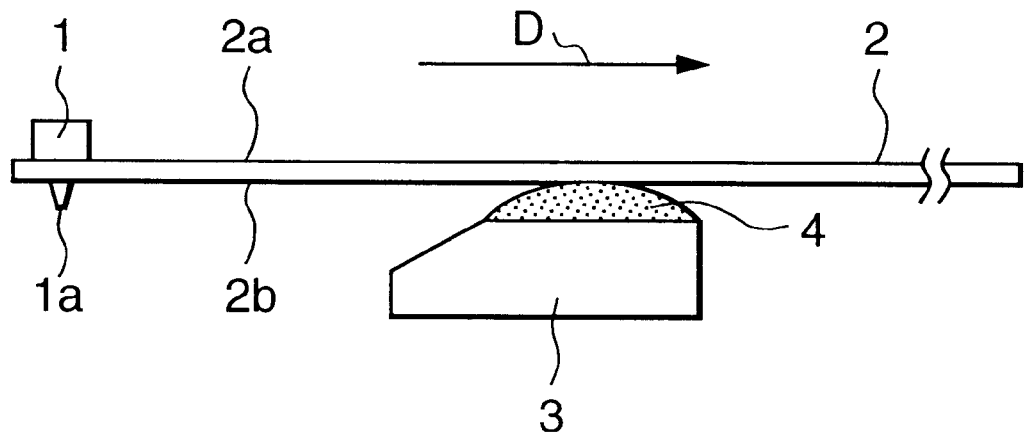
FIG. 1A is a front view showing a flow soldering state.
Figure 1B:
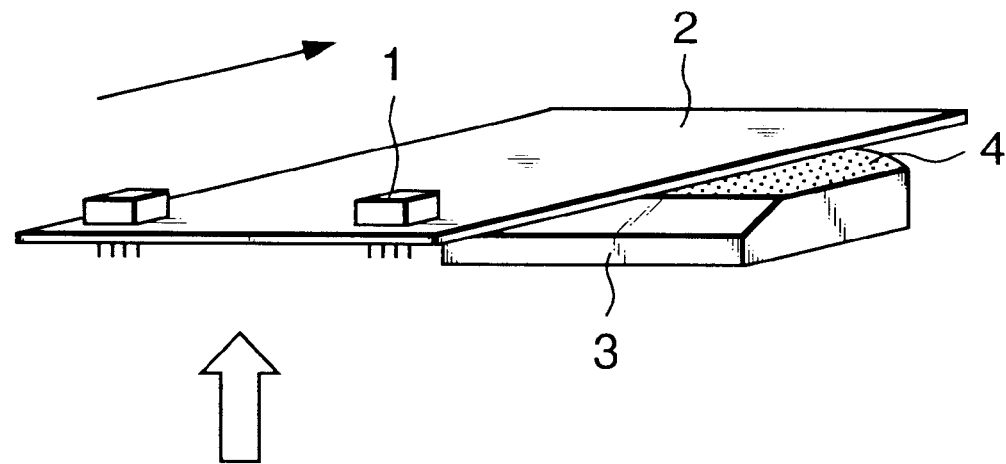
FIG. 1B is a perspective view of an outer appearance showing the flow soldering state.

FIG. 1A is a front view of an electronic circuit board showing a flow soldering state, and FIG. 1B is a perspective view of its outer appearance.

Figure 2A:
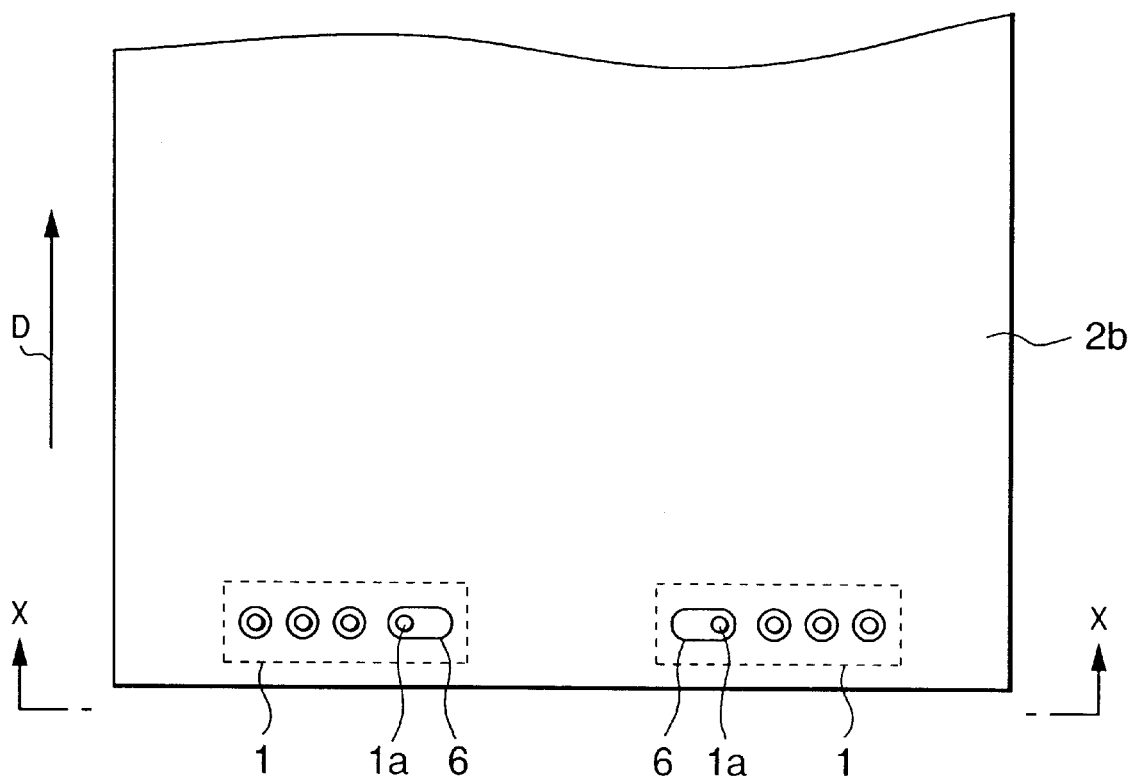
FIG. 2A is a plan view of a soldering surface 2b of a board 2.
Figure 2B:
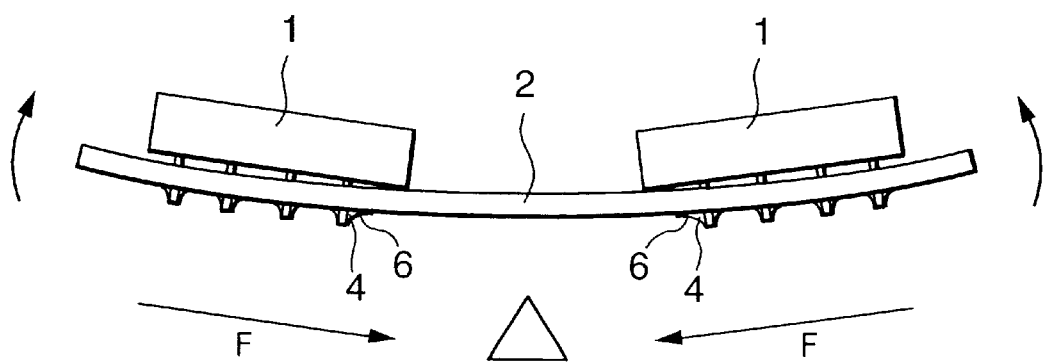
FIG. 2B is a view taken along the line X—X of arrows in FIG. 2A.
Figure 3A:
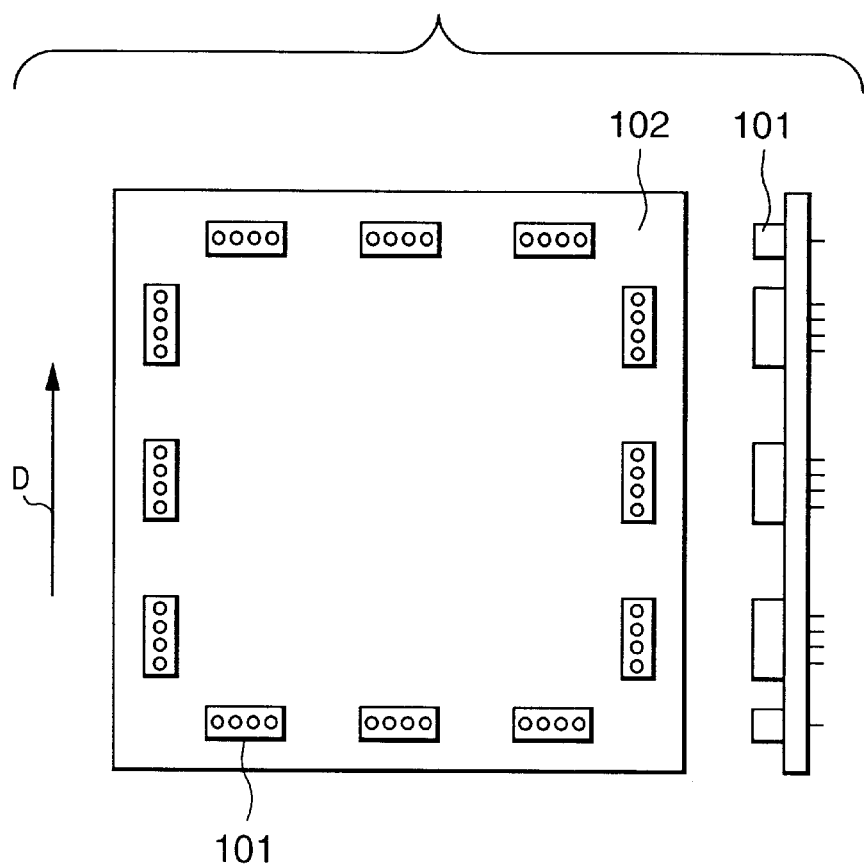
FIG. 3A is a plan view of a component mounting surface of a conventional board 102.
Figure 3B:
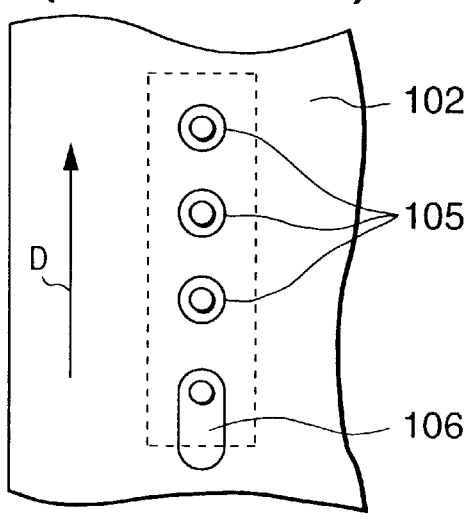
FIG. 3B is a view showing an excessive solder absorption land.

Referring to FIGS. 1A and 1B, a connector 1 having small pitches is arranged on the periphery of a board 2 formed with a component mounting surface 2a and a soldering surface 2b, such that its terminal array is perpendicular to a board flow direction D. Terminals 1a of the connector 1 are inserted in the through holes of the lands of the board 2, to project downward from the soldering surface 2b. A molten solder 4 jets upward from a solder tank 3 of a flow solder apparatus. From this state, the board 2 is moved in the direction of the arrow D by a convey means (not shown), and the lands and the terminals 1a are soldered. FIG. 2A is a plan view of the soldering surface 2b of the board 2, and FIG. 2B is a view taken along the line X—X in FIG. 2A. Referring to FIGS. 2A and 2B, circular soldering lands 5 each formed around the through hole as the center, and extending lands 6 for excessive solder absorption are formed at a portion downstream side of the warp, as shown in FIGS. 2A and 2B.

More specifically, it is known that during flow soldering the circuit board 2 warps downward as a result of thermal expansion. For the component terminal 1a, the extending land 6 formed to be directed towards the downstream side of the warp of the board 2 is arranged to correspond to the outermost terminal 1a, as shown in FIGS. 2A and 2B, and serves as an excessive solder absorption land for the component terminal 1a.

As described above, when the extending land 6 is formed to be substantially perpendicular to the convey direction D for flow soldering and to be directed toward the downstream side of the warp of the board 2, the excessive solder produced when the molten solder flows by its own weight in the direction of an arrow F, as shown in FIG. 2B, can be absorbed by the extending land 6. Therefore, the soldering error can be prevented, which is particularly effective for a connector having particularly small pitches.

The outermost terminal of the component described above indicates a terminal which is actually removed from the solder tank, regardless of the board flow direction, but depending on the warp of the board which occurs during flow soldering and the component array conditions. The excessive solder on a terminal which is removed from the solder tank before the outermost terminal can be efficiently attached by the excessive solder absorption land.

As a result, an inter-terminal solder bridge prevention effect can be obtained even for a component arranged perpendicularly to the board convey direction D. As a result, the soldering errors resulting from inter-terminal solder bridges is thus eliminated easily.

As described above, when a component is to be arranged such that its terminal array is perpendicular to the board conveyance direction D during flow soldering, or when an inter-terminal solder bridge is formed between different components, if an excessive solder absorption land is formed to correspond to this solder bridge portion at the terminal end of the actual exit order from the solder tank, the solder bridge, which cannot be conventionally eliminated, can be eliminated.

When the above method is employed together with the method of forming the extending land 106 on the connector 101 which is to be mounted along the arrow D of the flow solder convey direction, as described above, a solder bridge can be further prevented regardless of the component mounting direction.

As has been described above, according to the present invention, there is provided an electronic circuit board which can eliminate a soldering error for a component arranged such that its terminal array is perpendicular to the convey direction of the electronic circuit board which is to be flow-soldered, and a soldering method therefor.

As many apparently widely different embodiments of the present invention can be made without departing from the spirit and scope thereof, it is to be understood that the invention is not limited to the specific embodiments thereof except as defined in the appended claims.

What is claimed is:

1. An electronic circuit board, comprising:

a flow soldering surface having a warp direction, said flow soldering surface having (i) an upstream side from the warp and (ii) a downstream side from the warp; and one or more lands disposed on (i) the upstream side of the flow soldering surface and (ii) the downstream side of the flow soldering surface, only said one or more lands on the downstream side having extended portions, the extended portions extending along the warp direction.

2. The electronic circuit board according to claim 1, wherein said warp is formed by thermal expansion that takes place during flow soldering.

3. The electronic circuit board according to claim 1, wherein said extended portions extend towards the downstream side.

4. The electronic circuit board according to claim 1, wherein said plurality of lands are substantially perpendicular to a flow soldering conveyance direction of the electronic circuit board.

5. An electronic circuit board, comprising:

a flow soldering surface having a warp direction, said flow soldering surface having (i) an upstream side from the warp and (ii) a downstream side from the warp; and one or more lands disposed on (i) the upstream side of the flow soldering surface and (ii) the downstream side of the flow soldering surface, only said one or more lands on the downstream side having extended portions, the extended portions extending along the warp direction and formed by thermal expansion during flow soldering of a terminal of a multi-terminal component that includes a connector to the circuit board.

6. The electronic circuit board according to claim 5, wherein said plurality of lands are substantially perpendicular to a flow soldering conveyance direction of the electronic circuit board.

* * * * *

UNITED STATES PATENT AND TRADEMARK OFFICE
CERTIFICATE OF CORRECTION

PATENT NO. : 6,472,607 B1
DATED : October 29, 2002
INVENTOR(S) : Keisuke Someya et al.

It is certified that error appears in the above-identified patent and that said Letters Patent is hereby corrected as shown below:

Title page, Item [54] and Column 1, lines 1-3,
"ELECTRONIC CIRCUIT BOARD WITH KNOWN FLOW SOLDERING WARP DIRECTION" should read -- ELECTRONIC CIRCUIT BOARD AND SOLDERING METHOD THEREFOR --.

Title page,
Item [56], References Cited, FOREIGN PATENT DOCUMENTS,
"411145601 A" should read -- A 11-145601 --.
"403222493 A" should read -- A 3-222493 --.
"404061397 A" should read -- A 4-061397 --.
"407030241 A" should read -- A 7-030241 --.
"A 7-108744 A" should read -- A 7-106744 --.
"410107406 A" should read -- A 10-107406 --.
"410135276A " should read -- A 10-135276 --.
"410190163 A" should read -- A 10-190163 --.
"10-313168" should read -- A 10-313168 --.
"411126960 A" should read -- A 11-126960 --.
"411204930 A" should read -- A 11-204930 --.
"411068298 A" should read -- A 11-068298 --.
"411251734 A" should read -- A 11-251734 --.

Signed and Sealed this

Eleventh Day of November, 2003

JAMES E. ROGAN
*Director of the United States Patent and Trademark Office*